United States Patent
Tseng et al.

(10) Patent No.: US 11,287,388 B2
(45) Date of Patent: Mar. 29, 2022

(54) METHOD FOR INSPECTING A SEMICONDUCTOR ELEMENT AND INSPECTION APPARATUS FOR EXECUTING THE SAME

(71) Applicant: V5 TECHNOLOGIES CO., LTD., Hsinchu (TW)

(72) Inventors: Kuo-Ming Tseng, Hsinchu (TW); Yueh-Heng Lee, Hsinchu (TW)

(73) Assignee: V5 TECHNOLOGIES CO., LTD., Hsinchu (TW)

( * ) Notice: Subject to any disclaimer, the term of this patent is extended or adjusted under 35 U.S.C. 154(b) by 0 days.

(21) Appl. No.: 17/127,029

(22) Filed: Dec. 18, 2020

(65) Prior Publication Data

US 2022/0018789 A1 Jan. 20, 2022

(30) Foreign Application Priority Data

Jul. 17, 2020 (TW) .................................. 109124254

(51) Int. Cl.
*G01N 21/95* (2006.01)
*G01N 21/88* (2006.01)

(52) U.S. Cl.
CPC ..... *G01N 21/9501* (2013.01); *G01N 21/8803* (2013.01)

(58) Field of Classification Search
CPC ............ H01L 22/10; G01N 2021/8841; G01N 2021/887; G01N 2021/8887; G01N 21/88; G01N 21/8803; G01N 21/8806; G01N 21/9501; G01N 21/9503; G03F 7/70616; G03F 7/7065
See application file for complete search history.

(56) References Cited

U.S. PATENT DOCUMENTS

| | | | | |
|---|---|---|---|---|
| 5,096,291 A | * | 3/1992 | Scott | B23Q 1/5462 356/244 |
| 6,241,456 B1 | * | 6/2001 | Kato | H01L 21/6838 414/783 |
| 7,079,237 B2 | * | 7/2006 | Woo | G01N 21/9501 356/237.2 |
| 7,738,091 B2 | * | 6/2010 | Tsuji | G01N 21/94 356/237.4 |
| 2008/0156122 A1 | * | 7/2008 | Oh | H01L 21/67253 73/865.8 |

FOREIGN PATENT DOCUMENTS

CN 105489537 A * 4/2016 ....... H01L 21/67748

* cited by examiner

*Primary Examiner* — Gordon J Stock, Jr.
(74) *Attorney, Agent, or Firm* — Muncy, Geissler, Olds & Lowe, P.C.

(57) ABSTRACT

A method for inspecting a semiconductor element includes steps of: a) providing an inspection apparatus including a supporting unit that includes a central seat and a plurality of positioning plates, and a camera unit that includes a first image capture device; b) positioning the semiconductor element onto the positioning plates; c) capturing a first bottom image of the semiconductor element; d) generating relative movement between the semiconductor element and the positioning plates; e) capturing a second bottom image of the semiconductor element; and f) synthesizing the first bottom image and the second bottom image to obtain a complete bottom image of the semiconductor element.

16 Claims, 10 Drawing Sheets

METHOD FOR INSPECTING A SEMICONDUCTOR ELEMENT AND INSPECTION APPARATUS FOR EXECUTING THE SAME

CROSS-REFERENCE TO RELATED APPLICATION

This application claims priority to Taiwanese Invention Patent Application No. 109124254, filed on Jul. 17, 2020.

FIELD

The disclosure relates to a method for inspecting a semiconductor element and an inspection apparatus for executing the same, and more particularly to a method for inspecting a dual-sided semiconductor element and an inspection apparatus for executing the same.

BACKGROUND

Figure 1:
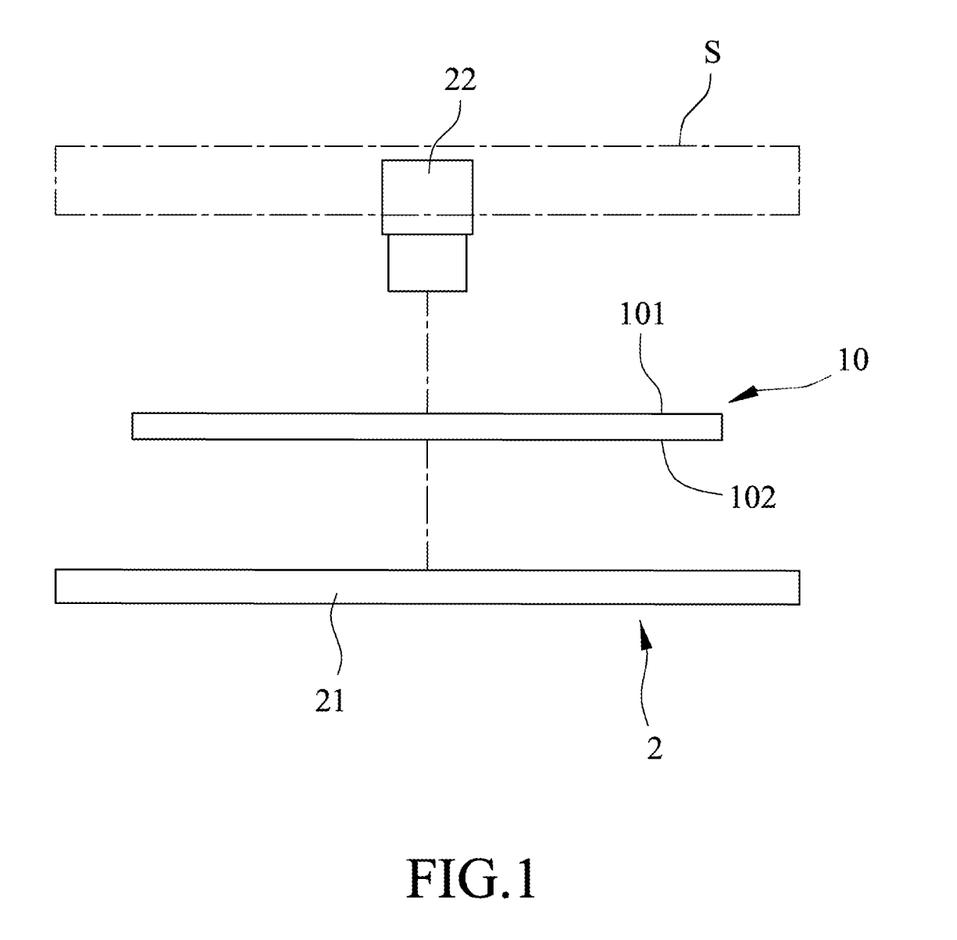
FIG. 1 is a schematic view illustrating a conventional inspection apparatus for inspecting a semiconductor element.

A conventional inspection apparatus 2 for inspecting a semiconductor element 10 is shown in FIG. 1. The inspection apparatus 2 includes a platform 21 and an image capture device 22. The platform 21 is for positioning the semiconductor element 10. The image capture device 22 is located above the platform 21 and is for capturing images of the semiconductor element 10 so as to inspect the semiconductor element 10. Wherein, the semiconductor element 10 has a top surface 101 that is formed with patterns, and a bottom, surface 102 that is opposite to the top surface 101.

A conventional method for inspecting the semiconductor element 10 includes steps of: a) providing the conventional inspection apparatus 2, b) positioning the semiconductor element 10 with the bottom surface 102 facing the platform 21, c) capturing, with light provided by a linear light source, images of the top surface 101 of the semiconductor element 10 by the image capture device 22, and d) inspecting the patterns formed on the top surface 101 of the semiconductor element 10.

In recent years, the semiconductor industry has grown exponentially and the semiconductor manufacturing processes have rapidly advanced to fabricate semiconductor elements with more layers or more complicated structures than ever. To cope with the sophisticated semiconductor manufacturing process and improve overall yield of semiconductor manufacturing, a method and an inspection apparatus that can further inspect a structure and defects of the bottom surface 102 of the semiconductor element 10 are required. Thus, the conventional method and the conventional inspection apparatus 2 can not meet the requirement of inspecting both of the bottom surface 102 and the top surface 101 of the semiconductor element 10.

SUMMARY

Therefore, an object of the disclosure is to provide a method for inspecting a semiconductor element that can alleviate the drawback of the prior art.

According to the disclosure, the method for inspecting the semiconductor element includes steps of: a) providing an inspection apparatus including a supporting unit that includes a central seat and a plurality of positioning plates, and a camera unit that includes a first image capture device; b) positioning the semiconductor element onto the positioning plates; c) capturing a first bottom image of the semiconductor element by the first image capture device; d) generating relative movement between the semiconductor element and the positioning plates; e) capturing a second bottom image of the semiconductor element by the first image capture device; and f) synthesizing the first bottom image and the second bottom image to obtain a complete bottom image of the semiconductor element.

The supporting unit of the inspection apparatus is adapted for supporting a bottom surface of the semiconductor element. The central seat of the supporting unit is movable along a central axis that extends in an up-down direction. The positioning plates surround the central seat and are spaced apart from each other. The camera unit of the inspection apparatus is spaced apart from the supporting unit. The first image capture device of the camera unit is for capturing images of the bottom surface of the semiconductor element. The bottom surface of the semiconductor element has a plurality of first surface portions, and a plurality of second surface portions that are configured not to overlap the first surface portions. In executing step b), the semiconductor element is positioned onto the positioning plates of the supporting unit such that projections of the positioning plates on the bottom surface of the semiconductor element are respectively located within the first surface portions of the semiconductor element. Step d) includes sub-steps of: d1) raising, by the central seat, the semiconductor element such that the semiconductor element is separated from the positioning plates, d2) generating relative rotation between the semiconductor element and the positioning plates about the central axis such that projections of the positioning plates on the bottom surface of the semiconductor element are respectively located within the second surface portions of the semiconductor element, and d3) lowering, by the central seat, the semiconductor element to position the semiconductor element onto the positioning plates.

Another object of the disclosure is to provide an inspection apparatus for inspecting a semiconductor element that can alleviate the drawback of the prior art.

According to the disclosure, the inspection apparatus for inspecting the semiconductor element includes a supporting unit and a camera unit. The supporting unit is adapted for supporting a bottom surface of the semiconductor element and includes a central seat and a plurality of positioning plates. The central seat is movable along a central axis that extends in an up-down direction. The positioning plates surround the central seat and are spaced apart from each other. The camera unit is spaced apart from the supporting unit and includes a first image capture device. The first image capture device is for capturing images of the bottom surface of the semiconductor element.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
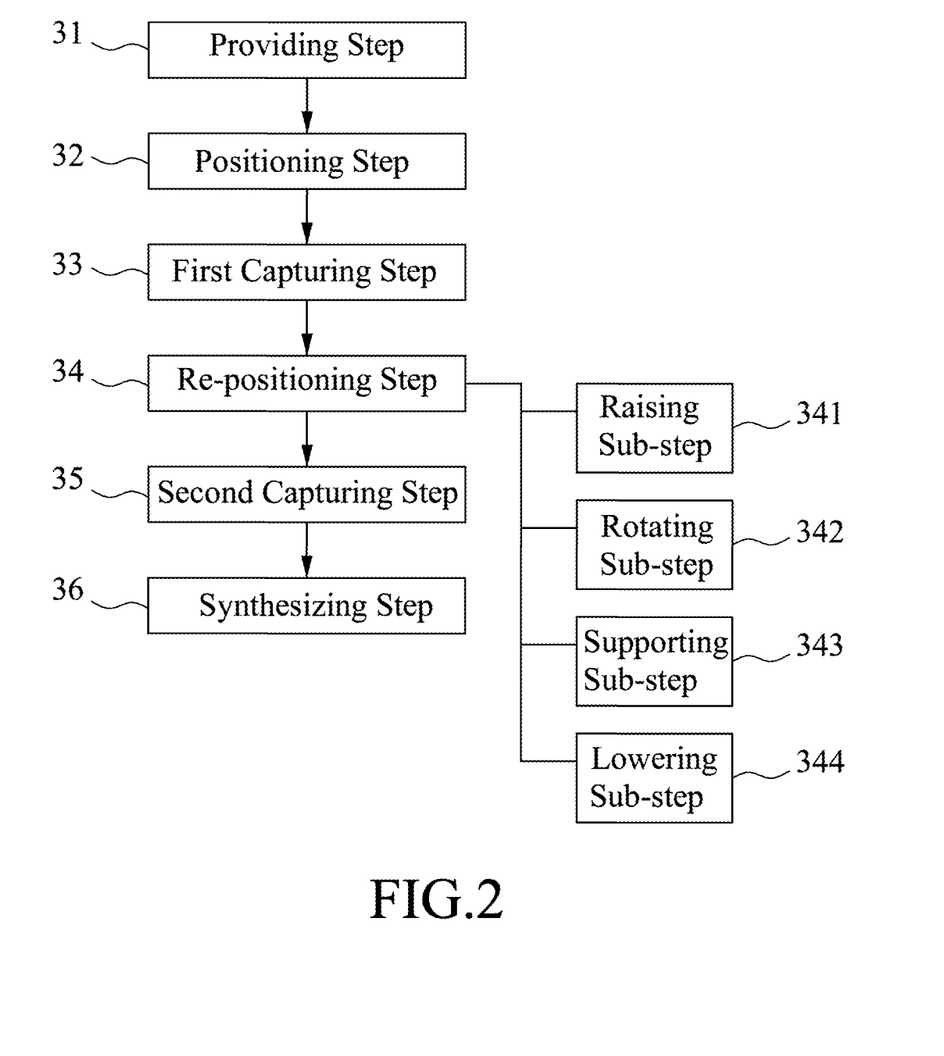
FIG. 2 is a flow diagram illustrating a first embodiment and a second embodiment of a method for inspecting a semiconductor element according to the disclosure.
Figure 3:
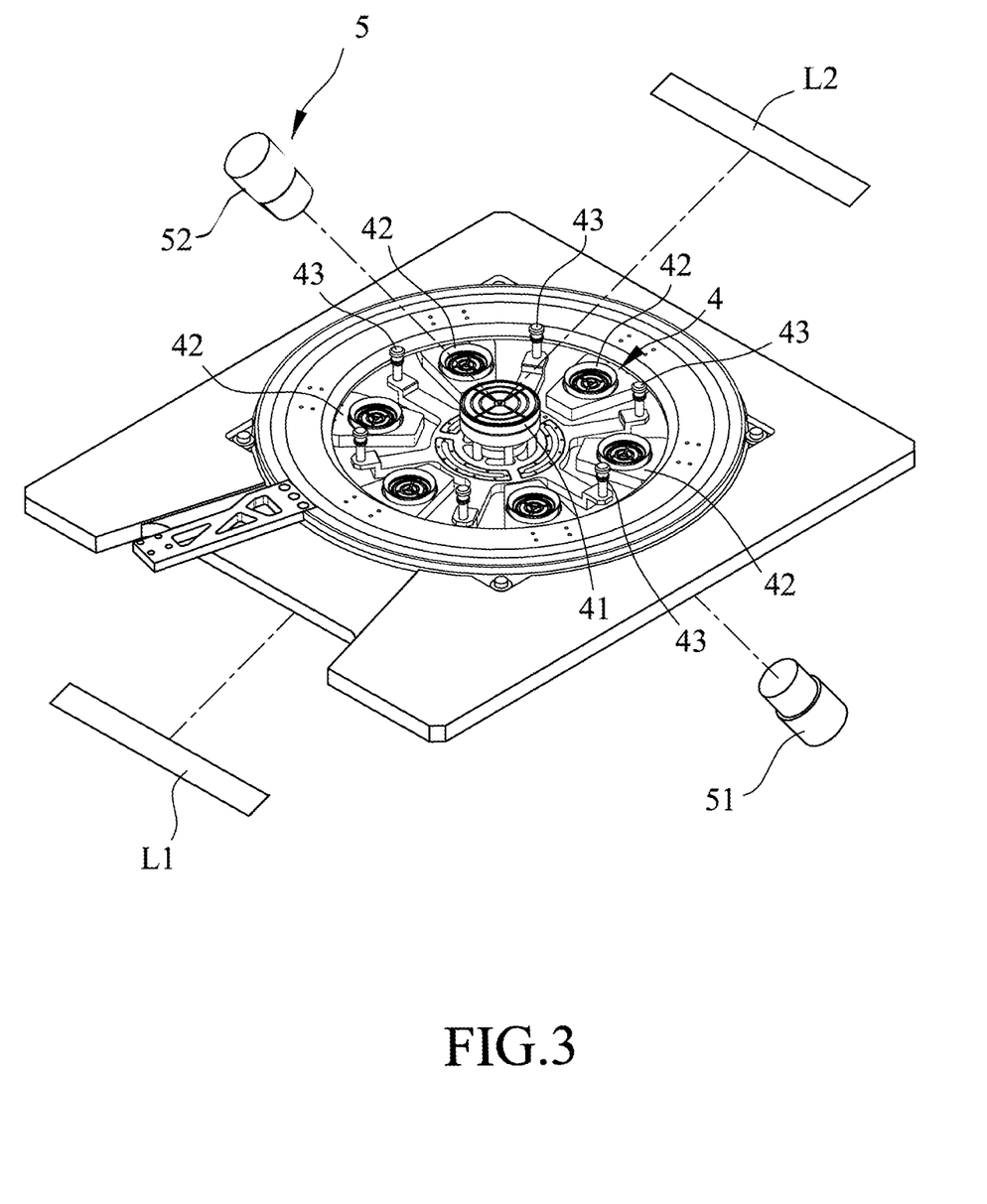
FIG. 3 is a schematic view illustrating an embodiment of an inspection apparatus for inspecting the semiconductor element according to the disclosure.

Referring to FIGS. 2 and 3, a first embodiment of a method for inspecting a semiconductor element according to the disclosure includes a providing step 31, a positioning step 32, a first capturing step 33, a re-positioning step 34, a second capturing step 35, and a synthesizing step 36. An embodiment of an inspection apparatus for inspecting the semiconductor element according to the disclosure cooperates with the method to inspect the semiconductor element. It should be noted that in the first embodiment of the method, and in the embodiment of the inspection apparatus, the semiconductor element that is inspected is a silicon wafer, but a different semiconductor element other than the silicon wafer can also be inspected in the practice of the disclosure.

During the providing step 31 of the method, the embodiment of the inspection apparatus is provided. The inspection apparatus includes a supporting unit 4 and a camera unit 5. The supporting unit 4 is adapted for supporting a bottom surface of the semiconductor element, and includes a central seat 41, six positioning plates 42, and six supporting rods 43. The central seat 41 is movable along and rotatable about a central axis that extends in an up-down direction. The positioning plates 42 surround the central seat 41 and are spaced apart from each other. The supporting rods 43 surround the central seat 41. In addition, the supporting rods 43 and the positioning plates 42 are disposed about the central axis in an alternating arrangement. The camera unit 5 is spaced apart from the supporting unit 4, and includes a first image capture device 51 and a second image capture device 52. The first image capture device 51 is for capturing images of the semiconductor element. The second image capture device 52 is spaced apart from the first image capture device 51 and is for capturing images of the semiconductor element. Wherein, the first image capture device 51 cooperates with a first light source (L1) for capturing the images of the bottom surface of the semiconductor element, and the second image capture device 52 is preferably positioned opposite from the first image capture device 51 relative to the supporting unit 4 and cooperates with a second light source (L2) for capturing images of a top surface of the semiconductor element. Therefore, without much shift in position, the second image capture device 52 can cooperate with the first image capture device 51 to capture the images of the top and bottom surfaces of the semiconductor element. The bottom surface of the semiconductor element has a plurality of first surface portions, and a plurality of second surface portions that are configured not to overlap the first surface portions.

Figure 4:
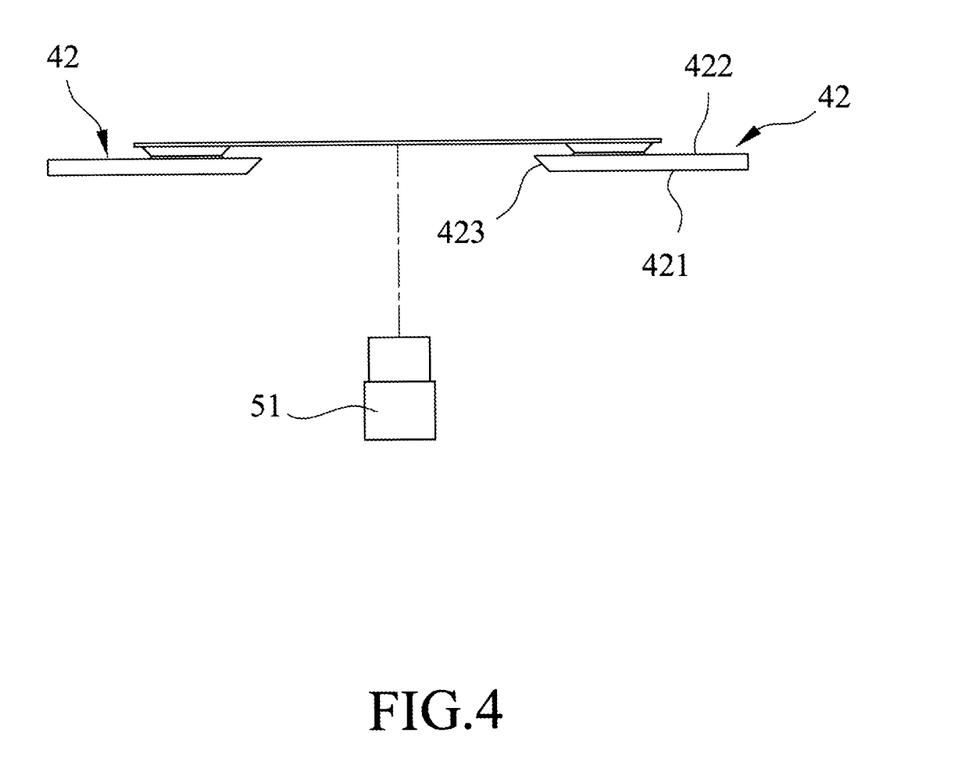
FIG. 4 is a side view illustrating a plurality of positioning plates of a supporting unit of the embodiment.

Referring to FIGS. 3 and 4, each of the positioning plates 42 of the supporting unit 4 has a lower surface 421 that is proximate to the first image capture device 51 of the camera unit 5, an upper surface 422 that is opposite to the lower surface 421, and a chamfered surface 423 that is connected between the lower surface 421 and the upper surface 422 and that is inclined downwardly and radially-outwardly. For each of the positioning plates 42, an area of the upper surface 422 is larger than that of the lower surface 421, and the chamfered surface 423 can minimize a lower edge portion of the positioning plate 42 that blocks light necessary for the images of the semiconductor element to be captured when the semiconductor element is positioned on the positioning plates 42. As such, the chamfered surface 423 of each of the positioning plates 42 eliminates influence of shadows that causes difficulty in identifying images so that quality of the images captured by the first image capture device 51 can be improved.

Figure 5:
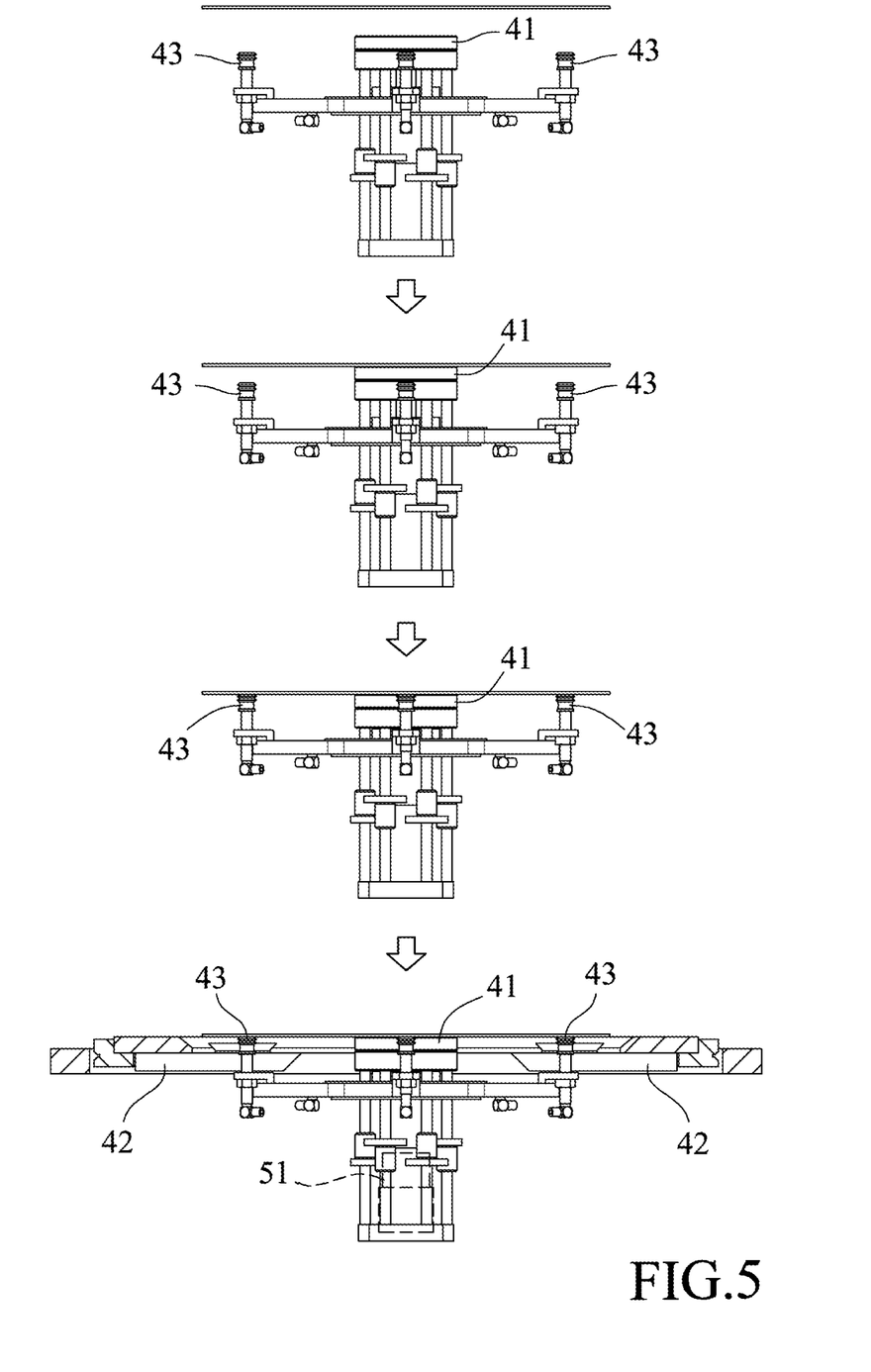
FIG. 5 illustrates a positioning step of the first embodiment in FIG. 2.

Referring to FIGS. 2, 3 and 5, it should be noted that each of the central seat 41, the positioning plates 42, and the supporting rods 43 of the supporting unit 4 is disposed with a vacuum-suction mechanism. There will be no further detail described for the vacuum-suction mechanism since a vacuum source that can be controlled for creating or removing a partial vacuum so as to suck or release a semiconductor element is widely-understood by those skilled in the art. In the beginning of the positioning step 32 of the method, the semiconductor element is positioned onto the central seat 41 with the bottom surface of the semiconductor element facing the central seat 41. Then, the supporting rods 43 cooperate with the central seat 41 to respectively provide support for a relatively peripheral area and a relatively central area of the semiconductor element. Next, the supporting rods 43 and the central seat 41 are simultaneously moved downwardly to cooperatively lower the semiconductor element so as to position the semiconductor element onto the positioning plates 42 such that projections of the positioning plates 42 on the bottom surface of the semiconductor element are respectively located within the first surface portions of the semiconductor element.

It should be noted that because of exponential growth of the semiconductor industry and rapid advancement in semiconductor manufacturing process, the inspection method and the apparatus must cope with semiconductor elements (e.g., wafers) with sizes equal or larger than 300 mm (usually referred to as "12-inch"), or semiconductor elements that are made of relatively soft materials or that are relatively pliable. In this embodiment, with the cooperation of the central seat 41 of the supporting unit 4 that supports the relatively central area of the semiconductor element, and the supporting rods 43 of the supporting unit 4 that support the relatively peripheral area of the semiconductor element, warpage of the semiconductor element can be prevented during the inspection even though the size of the semiconductor is relatively large. The semiconductor element without the warpage can be beneficial to the vacuum-suction mechanism and prevent distortion of the images of the semiconductor element. Therefore, performance of the inspection can be enhanced.

Figure 6:
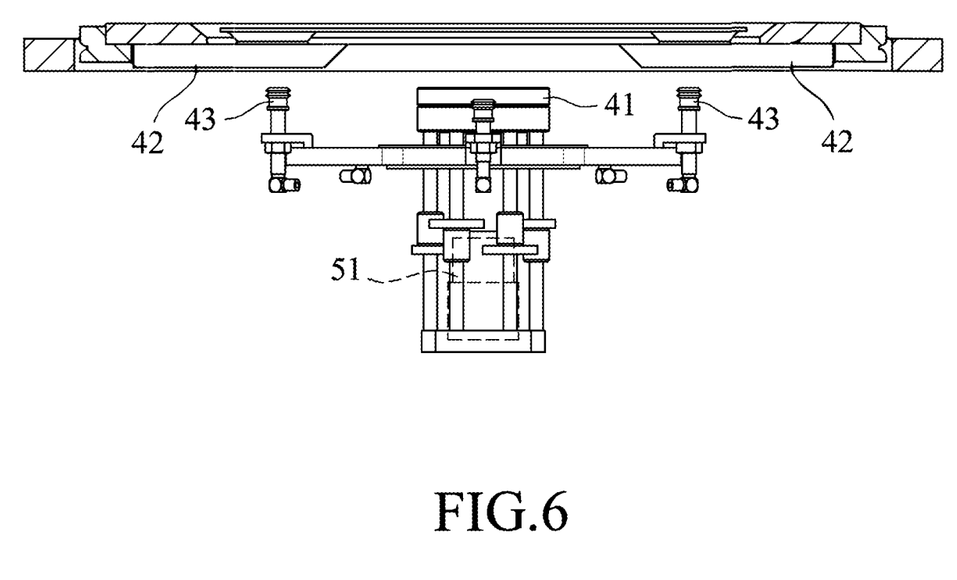
FIG. 6 is a schematic view illustrating a first capturing step of the first embodiment in FIG. 2.

Referring to FIGS. 2, 5 and 6, after the semiconductor element is positioned onto the positioning plates 42 of the supporting unit 4, and the projections of the positioning plates 42 on the bottom surface of the semiconductor element are respectively located within the first surface portions of the semiconductor element, the first capturing step 33 is executed. In executing the first capturing step 33, the central seat 41 and the supporting rods 43 of the supporting unit 4 further move downwardly so that the central seat 41 and the supporting rods 43 are separated from the semiconductor element. Then, the first image capture device 51 of the camera unit 5 captures a first bottom image of the bottom surface of the semiconductor element. Some parts of the bottom surface of the semiconductor element can not be shown in the first bottom image because of the projections of the positioning plates 42 on the bottom surface.

Figure 7:
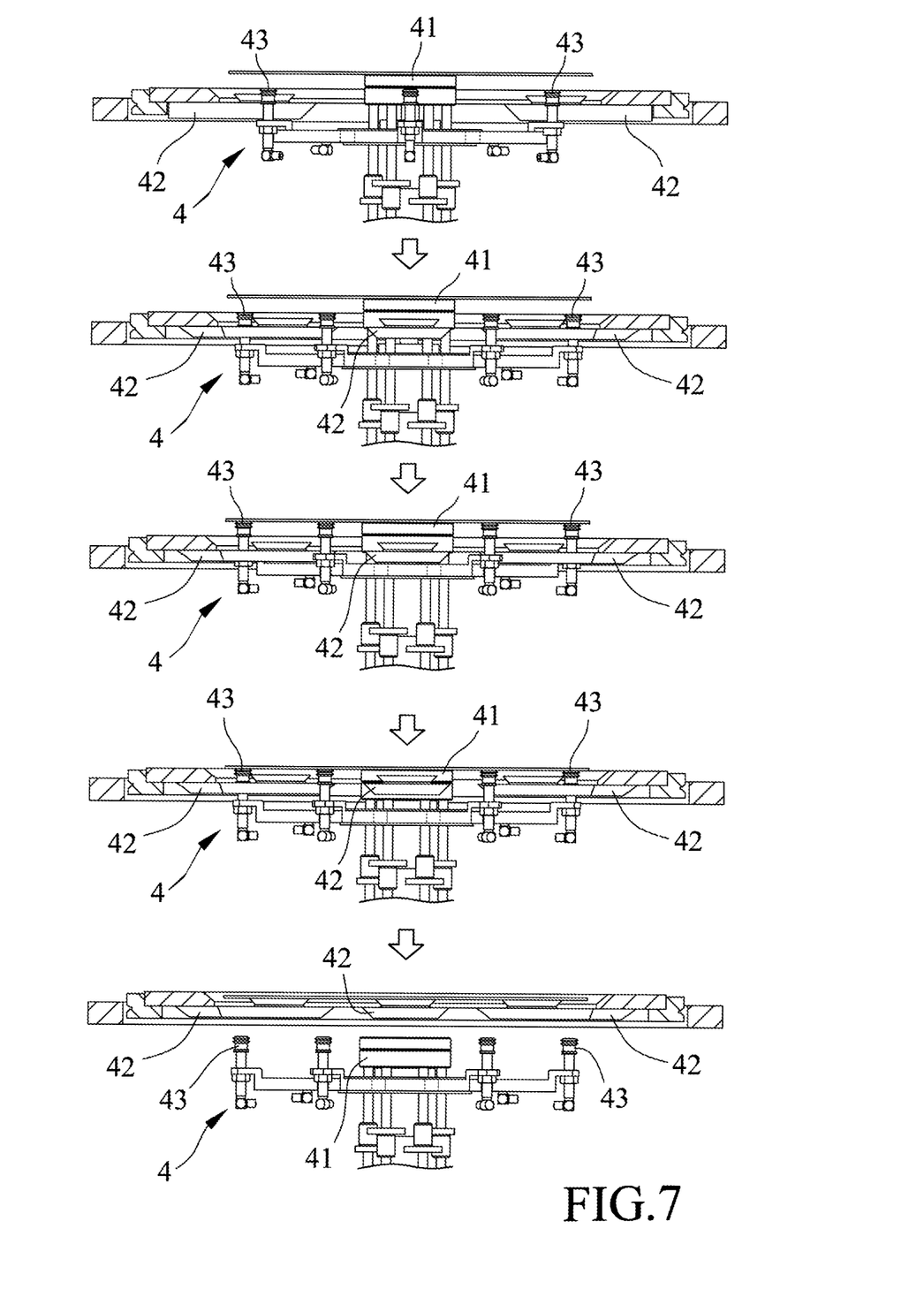
FIG. 7 illustrates a re-positioning step of the first embodiment in FIG. 2.
Figure 8:
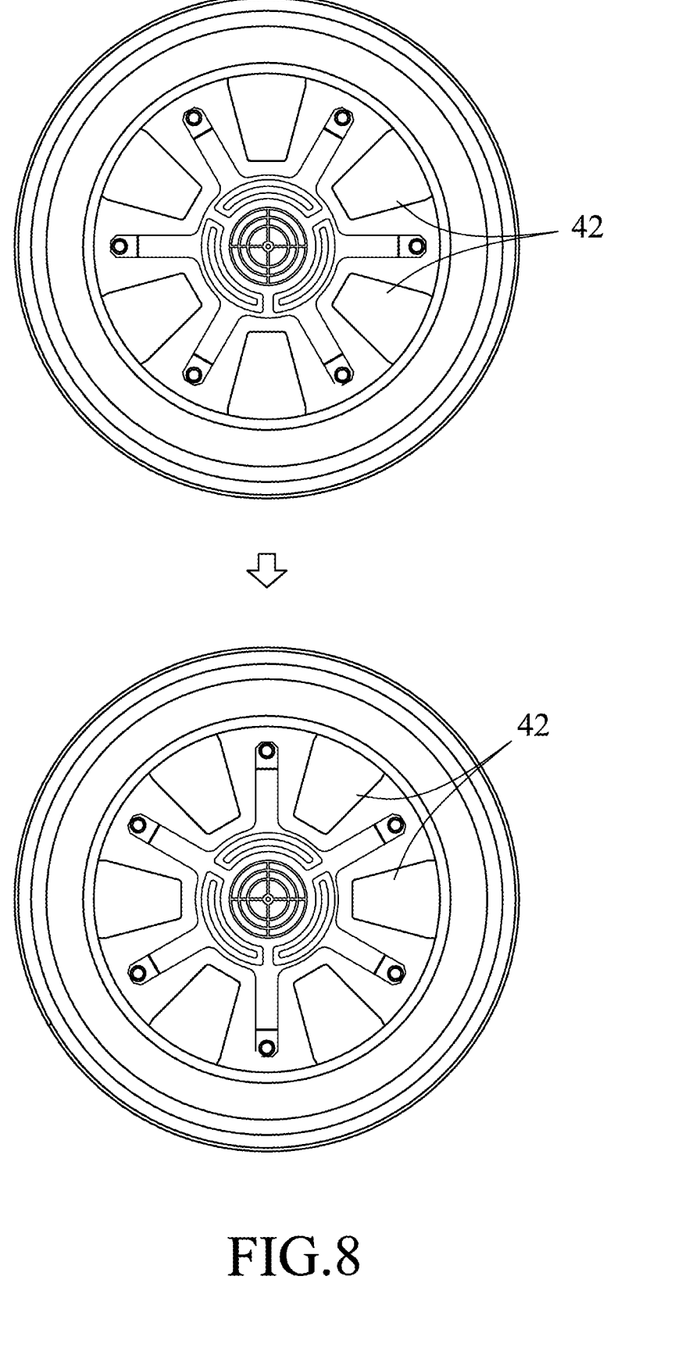
FIG. 8 illustrates a rotating sub-step of the first embodiment in FIG. 2.

Referring to FIGS. 2, 7 and 8, the re-positioning step 34 includes a raising sub-step 341, a rotating sub-step 342, a supporting sub-step 343, and a lowering sub-step 344. In executing the raising sub-step 341, the semiconductor element is raised by the central seat 41 of the supporting unit 4 such that the semiconductor element is separated from the positioning plates 42 of the supporting unit 4. In executing the rotating sub-step 342, relative rotation is generated between the semiconductor element and the positioning plates 42 about the central axis such that projections of the positioning plates 42 on the bottom surface of the semiconductor element are respectively located within the second surface portions of the semiconductor element. In the rotating sub-step 342 of the first embodiment of the method, the supporting rods 43 of the supporting unit 4 synchronously rotate with the positioning plates 42 about the central axis. In executing the supporting sub-step 343, the supporting rods 43 are moved toward the semiconductor element to cooperate with the central seat 41 to support the semiconductor element. In executing the lowering sub-step 344, the supporting rods 43 cooperate with the central seat 41 to lower the semiconductor element to position the semiconductor element onto the positioning plates 42. A positive integer larger than one is defined as (N), and the supporting unit 4 includes (N) positioning plates 42 that surround the central seat 41. Each of the positioning plates 42 is equiangularly spaced apart from each other about the central axis. The angle of relative rotation generated between the semiconductor element and the positioning plates 42 about the central axis is (360/2N) degrees in executing the rotating sub-step 342. In the rotating sub-step 342 of the first embodiment of the method, there are six positioning plates 42, and the positioning plates 42 and the supporting rods 43 rotate thirty degrees relative to the central seat 41 as shown in FIG. 8.

In executing the second capturing step 35, a second bottom image of the bottom surface of the semiconductor element is captured by the first image capture device 51 of the camera unit 5. Because the second surface portions of the bottom surface are configured not to overlap the first surface portions of the bottom surface, and the projections of the positioning plates 42 on the bottom surface have been respectively located within the second surface portions in executing the rotating sub-step 342, the second bottom image is different from the first bottom image.

In executing the synthesizing step 36, the first bottom image and the second bottom image of the semiconductor element are synthesized to obtain a complete bottom image of the semiconductor element. According to the abovementioned description about executing the second capturing step 35, the parts of the bottom surface of the semiconductor element that can not be shown in the first bottom image are certainly shown in the second bottom image. Therefore, the bottom image of the semiconductor element obtained by synthesizing the first bottom image and the second bottom image is certainly completed, so that the purpose of the method for inspecting the semiconductor element, especially the bottom surface of the semiconductor element, can be met.

It should be noted that, because of the purpose of the method, the abovementioned description is emphasized on capturing the images of the bottom surface of the semiconductor element, where the projections of the positioning plates 42 of the supporting unit 4 are located. However, the second image capture device 52 of the camera unit 5 is still disposed for capturing the images of the top surface of the semiconductor element. In order to simplify the steps of the method, the second image capture device captures the images of the top surface of the semiconductor element when the first image capture device 51 captures the images of the bottom surface of the semiconductor element in executing the first capturing step 33 or in executing the second capturing step 35.

Figure 9:
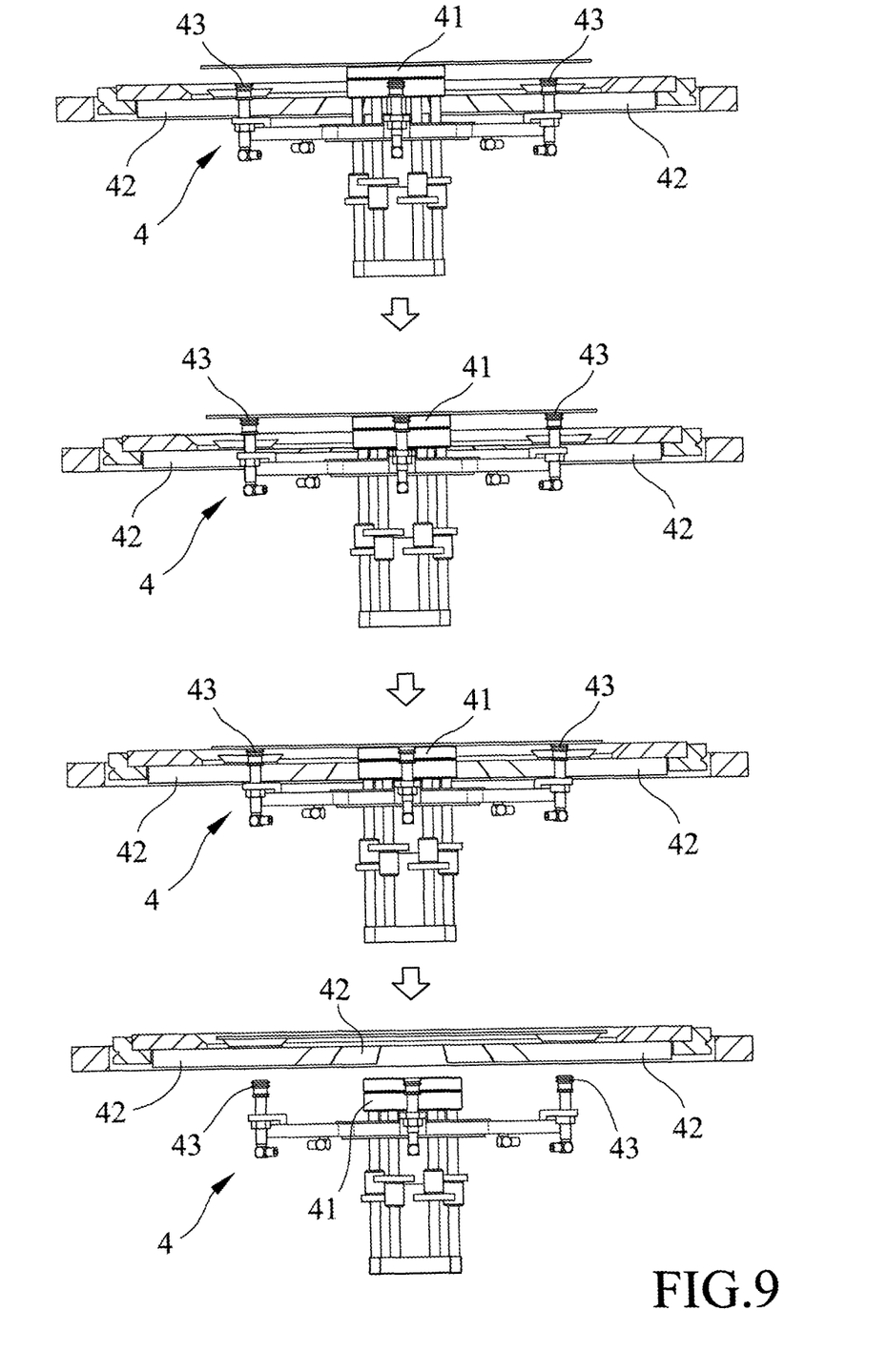
FIG. 9 illustrates the second embodiment.
Figure 10:
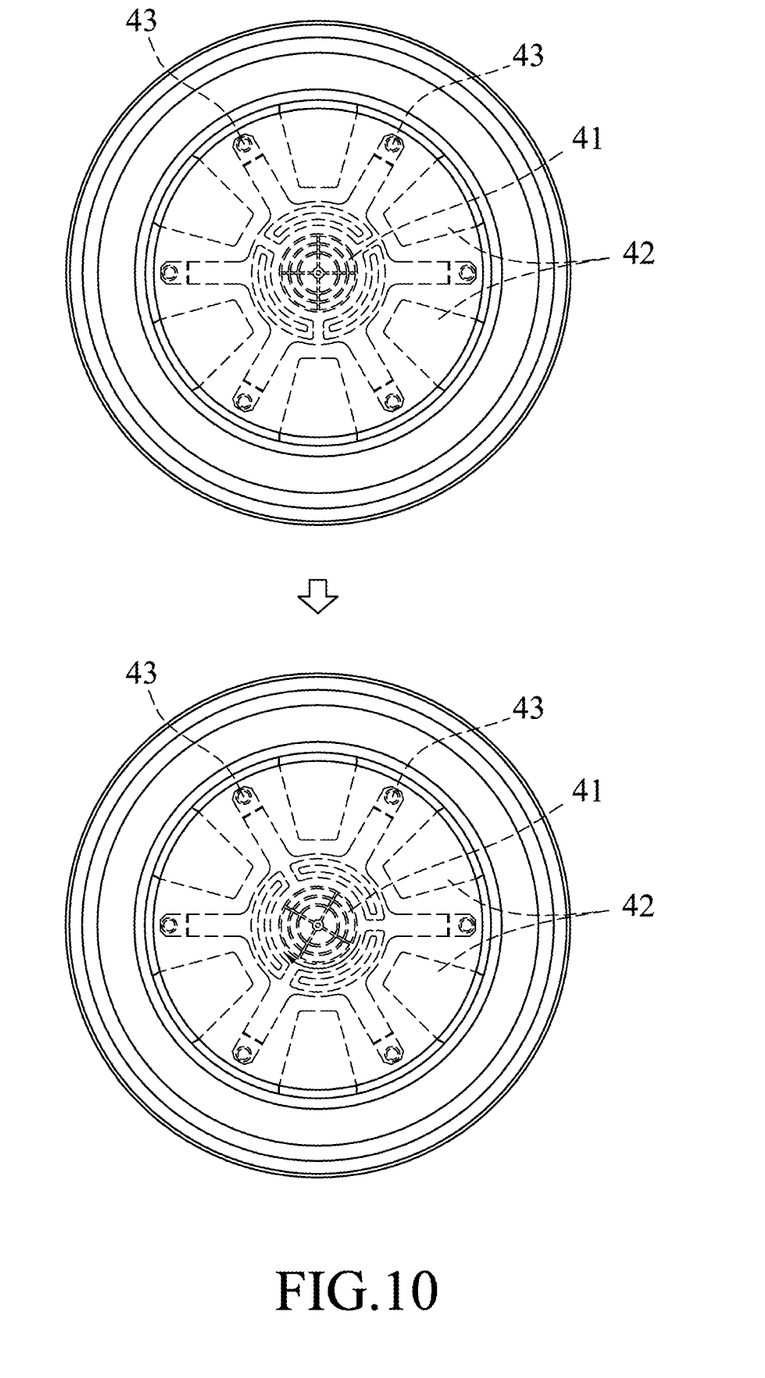
FIG. 10 illustrates a rotating sub-step of the second embodiment in FIG. 2.

Referring to FIGS. 2, 9 and 10, a second embodiment of the method for inspecting the semiconductor element according to the disclosure is shown. A distinctive difference between the first embodiment and the second embodiment of the method is the relative rotation generated between the semiconductor element and the positioning plates 42 of the supporting unit 4 about the central axis in executing the rotating sub-step 342 of the re-positioning step 34 (see FIG. 2). That is to say, in the first embodiment, the positioning plates 42 and the supporting rods 43 of the supporting unit 4 synchronously rotate about the central axis, but in the second embodiment, the central seat 41 of the supporting unit 4 rotates about the central axis and drives the semiconductor element to synchronously rotate. Even though the first embodiment differs from the second embodiment in executing the rotating sub-step 342, the angle of the relative rotation in the first embodiment and that in the second embodiment are the same. In other words, as long as the angle of the relative rotation generated between the semiconductor element and the positioning plates 42 about the central axis is ensured to make the projections of the positioning plates 42 on the bottom surface of the semiconductor element be respectively located within the second surface portions that do not overlap the first surface portions, where the projections of the positioning plates 42 are located in executing the positioning step 32, in executing the rotating sub-step 342, the complete bottom image of the semiconductor element can certainly be obtained by synthesizing the first bottom image and the second bottom image of the bottom surface of the semiconductor element in executing the synthesizing step 36. Therefore, the purpose of the method for inspecting the semiconductor element, especially the bottom surface of the semiconductor element, can be met.

Referring to FIGS. 2 and 3, it is further noted that in practice, the bottom surface of the semiconductor element may be coated with a transparent photoresist or other materials, which eventually causes difficulty of synthesizing the images of the semiconductor element. A result of the synthesizing step 36 is mainly affected by an optical path difference. In the first embodiment and the second embodiment of the method according to the disclosure, the optical path difference is related to the uniformity of the thickness of the photoresist coated on the semiconductor element, and different angles of incidence of the incident rays of the first light source (L1) (and therefore different angles of reflection of the reflected rays of the first light source (L1)) passing through different points of the photoresist. The photoresist with uneven thickness, and the different angles of incidence of the incident rays of the first light source (L1) lead to different wavelengths and interferences that affect the result of the synthesizing step 36. For example, in the rotating sub-step 342 of the generating step 34 of the second embodiment of the method, the angle of incidence of the incident ray of the first light source (L1) at any specific point of the bottom surface of the semiconductor element is different from the angle of incidence of the incident ray of the first light source (L1) at the specific point of the bottom surface of the semiconductor element after the central seat 41 of the supporting unit 4 and the semiconductor element are rotated. Therefore, colors in the first bottom image and the second bottom image may be shown differently at the same positions of the semiconductor element. Therefore, when synthesizing the first bottom image and the second bottom image in executing the synthesizing step 36, gaps are formed by the failure of focusing the different colors at junctions of the first bottom image and the second bottom image, and make the defect inspection slightly harder than in the first embodiment. However, in the rotating sub-step 342 of the first embodiment, only the positioning plates 42 and the supporting rods 43 of the supporting unit 4 rotate. Since the semiconductor element does not rotate, the angles of incidence at any specific point do not change. Therefore, the complete bottom image of the semiconductor element obtained in executing the synthesizing step 36 can be ensured to be clear and easy for the inspection.

In summary, even though the bottom surface of the semiconductor element is supported by the supporting unit 4, the method for inspecting the semiconductor element and the inspection apparatus for executing the same according to the disclosure can still obtain the complete bottom image of the semiconductor element by synthesizing the first bottom image, and the second bottom image that is captured after the relative rotation generated between the semiconductor element and the positioning plates 42 of the supporting unit 4 about the central axis. Since the complete bottom image of the semiconductor element is ensured to be obtained, the purpose of the method for inspecting the semiconductor element according to the disclosure, especially for inspecting the bottom surface of the semiconductor element, can certainly be achieved.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A method for inspecting a semiconductor element, comprising steps of:
   a) providing an inspection apparatus, said inspection apparatus including
      a supporting unit that is adapted for supporting a bottom surface of the semiconductor element, and that includes
         a central seat movable along a central axis that extends in an up-down direction, and
         a plurality of positioning plates surrounding said central seat and spaced apart from each other, and
      a camera unit that is spaced apart from said supporting unit, and that includes a first image capture device for capturing images of the bottom surface of the semiconductor element, the bottom surface of the semiconductor element having a plurality of first surface portions, and a plurality of second surface portions that are configured not to overlap the first surface portions;
   b) positioning the semiconductor element onto said positioning plates such that projections of said positioning plates on the bottom surface of the semiconductor element are respectively located within the first surface portions of the semiconductor element;
   c) capturing, by said first image capture device, a first bottom image of the semiconductor element;
   d) generating relative movement between the semiconductor element and said positioning plates, step d) including sub-steps of
      d1) raising, by said central seat, the semiconductor element such that the semiconductor element is separated from said positioning plates,
      d2) generating relative rotation between the semiconductor element and said positioning plates about the central axis such that projections of said positioning plates on the bottom surface of the semiconductor element are respectively located within the second surface portions of the semiconductor element, and
      d3) lowering, by said central seat, the semiconductor element to position the semiconductor element onto said positioning plates;
   e) capturing, by said first image capture device, a second bottom image of the semiconductor element; and
   f) synthesizing the first bottom image and the second bottom image to obtain a complete bottom image of the semiconductor element.

2. The method as claimed in claim 1, wherein said camera unit further includes a second image capture device, said second image capture device capturing a top image of a top surface of the semiconductor element in executing step c).

3. The method as claimed in claim 1, wherein said camera unit further includes a second image capture device, said second image capture device capturing a top image of a top surface of the semiconductor element in executing step e).

4. The method as claimed in claim 1, wherein a positive integer larger than one is defined as (N), said supporting unit including (N) positioning plates that surround said central seat, each of said positioning plates being equiangularly spaced apart from each other about the central axis, said positioning plates rotating (360/2N) degrees relative to said central seat in executing step d).

5. The method as claimed in claim 1, wherein a positive integer larger than one is defined as (N), said supporting unit including (N) positioning plates that surround said central seat, each of said positioning plates being equiangularly spaced apart from each other about the central axis, said central seat rotating (360/2N) degrees relative to said positioning plates in executing step d).

6. The method as claimed in claim 1, wherein said supporting unit further includes a plurality of supporting rods that surround said central seat, said supporting rods and said positioning plates being disposed about the central axis in an alternating arrangement.

7. The method as claimed in claim 6, wherein in executing sub-step d2), said supporting rods synchronously rotate with said positioning plates about the central axis.

8. The method as claimed in claim 7, wherein step d) further includes, between sub-step d2) and sub-step d3), a sub-step of d4) moving said supporting rods toward the semiconductor element to cooperate with said central seat to support the semiconductor element.

9. The method as claimed in claim 8, wherein in executing sub-step d3), said supporting rods cooperate with said central seat to lower the semiconductor element to position the semiconductor element onto said positioning plates.

10. The method as claimed in claim 6, wherein in sub-step d2), said central seat rotates about the central axis.

11. The method as claimed in claim 10, wherein step d) further includes, between sub-step d2) and sub-step d3), a sub-step of d4) moving said supporting rods toward the semiconductor element to cooperate with said central seat to support the semiconductor element.

12. The method as claimed in claim 11, wherein in executing sub-step d3), said supporting rods cooperate with said central seat to lower the semiconductor element to position the semiconductor element onto said positioning plates.

13. An inspection apparatus for inspecting a semiconductor element, comprising:
a supporting unit that is adapted for supporting a bottom surface of the semiconductor element, and that includes
a central seat movable along a central axis that extends in an up-down direction, and
a plurality of positioning plates surrounding said central seat and spaced apart from each other; and
a camera unit that is spaced apart from said supporting unit, and that includes a first image capture device for capturing images of the bottom surface of the semiconductor element;
wherein said supporting unit further includes a plurality of supporting rods that surround said central seat, said supporting rods and said positioning plates being disposed about the central axis in an alternating arrangement.

14. The inspection apparatus as claimed in claim 13, wherein said camera unit further includes a second image capture device that is for capturing images of the semiconductor element.

15. An inspection apparatus for inspecting a semiconductor element, comprising:
a supporting unit that is adapted for supporting a bottom surface of the semiconductor element, and that includes
a central seat movable along a central axis that extends in an up-down direction, and
a plurality of positioning plates surrounding said central seat and spaced apart from each other; and
a camera unit that is spaced apart from said supporting unit, and that includes a first image capture device for capturing images of the bottom surface of the semiconductor element;
wherein each of said positioning plates has a lower surface that is proximate to said first image capture device, an upper surface that is opposite to said lower surface, and a chamfered surface that is connected between said lower surface and said upper surface, for each of said positioning plates, an area of said upper surface being larger than that of said lower surface.

16. The inspection apparatus as claimed in claim 15, wherein said camera unit further includes a second image capture device that is for capturing images of the semiconductor element.

* * * * *